United States Patent
Nakagami et al.

(10) Patent No.: US 8,313,307 B2
(45) Date of Patent: Nov. 20, 2012

(54) ELECTRIC COMPRESSOR

(75) Inventors: Takashi Nakagami, Aichi-ken (JP);
Shunsuke Yakushiji, Aichi-ken (JP);
Koji Nakano, Aichi-ken (JP); Masahiko Asai, Aichi-ken (JP); Makoto Hattori, Aichi-ken (JP); Kazuki Niwa, Aichi-ken (JP)

(73) Assignee: Mitsubishi Heavy Industries, Ltd., Tokyo (JP)

( * ) Notice: Subject to any disclaimer, the term of this patent is extended or adjusted under 35 U.S.C. 154(b) by 722 days.

(21) Appl. No.: 12/298,969

(22) PCT Filed: Jun. 27, 2008

(86) PCT No.: PCT/JP2008/061695
§ 371 (c)(1),
(2), (4) Date: Apr. 2, 2009

(87) PCT Pub. No.: WO2009/066484
PCT Pub. Date: May 28, 2009

(65) Prior Publication Data
US 2010/0232991 A1    Sep. 16, 2010

(30) Foreign Application Priority Data
Nov. 20, 2007   (JP) ................................ 2007-300521

(51) Int. Cl.
*F04B 49/06* (2006.01)
(52) U.S. Cl. .................. 417/44.1; 417/410.1; 417/423.7
(58) Field of Classification Search ................. 417/44.1, 417/410.1, 423.7
See application file for complete search history.

(56) References Cited

U.S. PATENT DOCUMENTS

| | | | | |
|---|---|---|---|---|
| 2003/0200761 A1* | 10/2003 | Funahashi et al. | ........... | 62/228.4 |
| 2005/0204760 A1* | 9/2005 | Kurita et al. | ................. | 62/228.1 |
| 2006/0007721 A1* | 1/2006 | Rodriguez et al. | ........... | 363/146 |
| 2008/0205107 A1* | 8/2008 | Hattori et al. | ................. | 363/123 |

FOREIGN PATENT DOCUMENTS

| | | |
|---|---|---|
| JP | 52-60255 U | 10/1977 |
| JP | 57-14975 U | 6/1980 |
| JP | 02-68954 A | 3/1990 |
| JP | 07-320801 A | 12/1995 |
| JP | 2003-324903 A | 11/2003 |
| JP | 2005-36773 A | 2/2005 |

OTHER PUBLICATIONS

Japanese Office Action dated Apr. 11, 2012, issued in corresponding Japanese Patent Application No. 2007300521.

* cited by examiner

*Primary Examiner* — Anh Mai
*Assistant Examiner* — Kevin Quarterman
(74) *Attorney, Agent, or Firm* — Westerman, Hattori, Daniels & Adrian, LLP

(57) ABSTRACT

In an inverter control apparatus in which a control circuit board is fixed by use of pin-like terminals provided in a power board, the breakage of the pin-like terminals is prevented. The power board 160 is provided with a plurality of signal transmission terminals 210a, 210b, 220a, 220b for signal transmission to and from the control circuit board 150 and for grounding along each of a pair of opposed sides, the control circuit board 150 is electrically connected to the plurality of signal transmission terminals 210a etc. and is fixed by soldering to the plurality of signal transmission terminals 210a etc., and the plurality of signal transmission terminals 210a etc. are arranged along each of the pair of sides in a plurality of rows.

4 Claims, 10 Drawing Sheets

Figure 10

ELECTRIC COMPRESSOR

TECHNICAL FIELD

The present invention relates to an electric compressor in which an electric motor that drives a compression mechanism and an inverter control apparatus that controls the electric motor are integrated with the compression mechanism and, more particularly, to an electric compressor in which an inverter control apparatus is provided with a control circuit board and a power board.

BACKGROUND ART

A vehicle-mounted air conditioner in an electric vehicle, a fuel-cell electric vehicle and the like, on which no engine is mounted, has a compressor in which an electric motor is built, as a power source that compresses and circulates a refrigerant. Because it is necessary that this electric motor rotate at a desired rpm according to an instruction from a main control apparatus of the air conditioner, it is necessary to separately provide a control apparatus. This control apparatus is composed of electric circuits and electronic circuits. Specifically, this control apparatus is provided with switching elements (power transistor elements), such as IGBTs (insulated gate bipolar transistors) and FETs (field effect transistors) for constituting what is called an inverter circuit (a switching circuit), including electronic elements, such as central processing units and memories. From space-saving requirements, an electric compressor in which this control apparatus, along with a compression mechanism and an electric motor, is built in one housing is under study. In the following, this electric compressor may sometimes be referred to as an integrated electric compressor.

Compared to a stationary electric compressor, large vibrations and impacts are applied to an integrated electric compressor mounted on a vehicle. With respect to this problem, Patent Document 1 makes the following proposal.

That is, in an integrated electric compressor, it is necessary to connect an inverter circuit and an external electronic control unit (ECU) by use of a multicore communication cable and similarly it is necessary to connect a battery and the inverter circuit by use of a power cable. In order to facilitate the assembling, replacement and repair of this integrated electric compressor, it is most suitable to combine the power cable, communication cable and inverter circuit by use of connectors. However, as described above, in an integrated electric compressor, vibrations and impacts acting on connections obtained by connectors are exceedingly large and, therefore, there is a possibility that the electrical contact properties of terminals of the connectors worsen.

Therefore, Patent Document 1 describes that a motor-side power connector and a motor-side communication connector are composed of a connection terminal, which is substantially vertically provided in a standing manner, and a resin body part, which is formed integrally with a resin frame part so that a cable-side power connector and a cable-side communication connector can be substantially vertically inserted and extracted. Patent Document 1 describes that according to this arrangement, the terminals of the motor-side connectors and the terminals of the cable-side connectors provide facing surfaces in substantially horizontal directions so as to be slidable substantially vertically and, therefore, the vibration resistance is significantly improved compared to other terminal connection conditions.

Patent Document 1: Japanese Patent No. 3802477

Incidentally, if an inverter circuit is separated into a power board that converts a direct current supplied from a high-voltage power source into an alternating current and applies the alternating current to an electric motor and a control circuit board that controls the application of the alternating current to the electric motor, it is possible to reduce the area of the inverter circuit in a planar direction. Therefore, this contributes to the downsizing of an integrated electric compressor. In this integrated electric compressor, it is effective to perform the fixing of the power board to the control circuit board by using pin-like terminals provided on the power board side for the downsizing of the integrated electric compressor. The pin-like terminals include at least two kinds of terminals. One is a terminal for signal transmission between the power board and the control circuit board, and the other is a terminal for the grounding of the power board and the control circuit board.

According to examinations by the present inventors, which will be later described in detail, it became apparent that the pin-like terminal may be broken if vibrations are applied to the power board and the control circuit board.

In an integrated electric compressor in which the fixing of a power board to a control circuit board is performed by using pin-like terminals provided on the power board side, the present invention has as its object to prevent the breakage of the pin-like terminals due to vibrations.

DISCLOSURE OF THE INVENTION

The present invention achieves the above-described object by providing an electric compressor comprising a compression mechanism that sucks in a refrigerant, and compresses and discharges the refrigerant, an electric motor that drives the compression mechanism, an inverter control apparatus that has a power board that converts a direct current supplied from a high-voltage power source into an alternating current and applies the alternating current to the electric motor and a control circuit board that controls application of the alternating current to the electric motor and controls driving of the electric motor, and a housing that houses the compression mechanism, the electric motor and the inverter control apparatus. In addition, this electric compressor is characterized in that the power board is provided with a plurality of pin-like terminals for signal transmission to and from the control circuit board and for grounding along each of a pair of opposed sides, the control circuit board is electrically connected to the plurality of pin-like terminals and is fixed by soldering to the plurality of pin-like terminals, and the plurality of pin-like terminals are arranged along each of the pair of sides in a plurality of rows.

The present inventors found that in a case where pin-like terminals were arranged in a row on the power board, the pin-like terminals were broken if vibrations were applied to the power board and the control circuit board. That is, deformation occurs in the control circuit board due to vibrations, with the result that bending stresses occur in the pin-like terminals, which are broken thereby. Therefore, the present inventors intend to prevent the breakage of pin-like terminals by suppressing the deformation occurring in the vicinity of the pin-like terminals of the control circuit board, which is accomplished by arranging the pin-like terminals along each of a pair of sides in a plurality of rows.

In the electric compressor of the present invention, when the power board is in the form of a box provided with a bottom plate and outer frames provided in a standing manner at peripheral edges of the bottom plate, it is preferred that a row nearest to the side of the plurality of rows is provided on the outer frames, that parts of the plurality of pin-like terminals belonging to the row nearest to the side are each buried in the outer frames, and that other parts that are continuous to the parts are provided so as to protrude from top end surfaces of the outer frames.

When pin-like terminals are arranged in two rows, it is sufficient to arrange pin-like terminals only in one row in the part of the bottom plate if pin-like terminals are arranged on the outer frames. With this arrangement, it is possible to ensure the area in which electronic parts are installed in the part of the bottom plate, and consequently, it is possible to reduce the size of the power board.

Furthermore, if pin-like terminals for grounding belong to the row nearest to the side and are arranged in end portions of the side, it becomes possible to ensure a long distance from the pin-like terminals for signal transmission to the pin-like terminals for grounding, and this can improve the insulating properties against the pin-like terminals for signal transmission. Furthermore, the distance between the terminals for grounding and the housing, which is to be grounded, can be minimized, and this is also advantageous from the standpoint of a reduction of electromagnetic noise.

In the electric compressor of the present invention, the power board and the control circuit board can be integrated and modularized. This facilitates the work of assembling an inverter device to the electric compressor.

According to the present invention, in an inverter control apparatus in which a control circuit board is fixed by use of pin-like terminals provided in a power board, the breakage of the pin-like terminals can be prevented.

DESCRIPTION OF SYMBOLS

10 . . . Electric compressor
11 . . . Housing
12 . . . Inverter control apparatus
15, 150 . . . Control circuit board
16, 160 . . . Power board
16A, 160A . . . Housing
16a, 16b, 16c, 16d, 160a, 160b, 160c, 160d . . . Outer frame
16e, 160e . . . Bottom plate
21, 210a, 210b . . . Signal transmission terminal
22, 220a, 220b . . . Grounding terminal

BEST MODE FOR CARRYING OUT THE INVENTION

The present invention will be described below on the basis of embodiments with reference to the accompanying drawings. In each of the drawings, the omission of members and interconnects may sometimes be performed.

Figure 1:
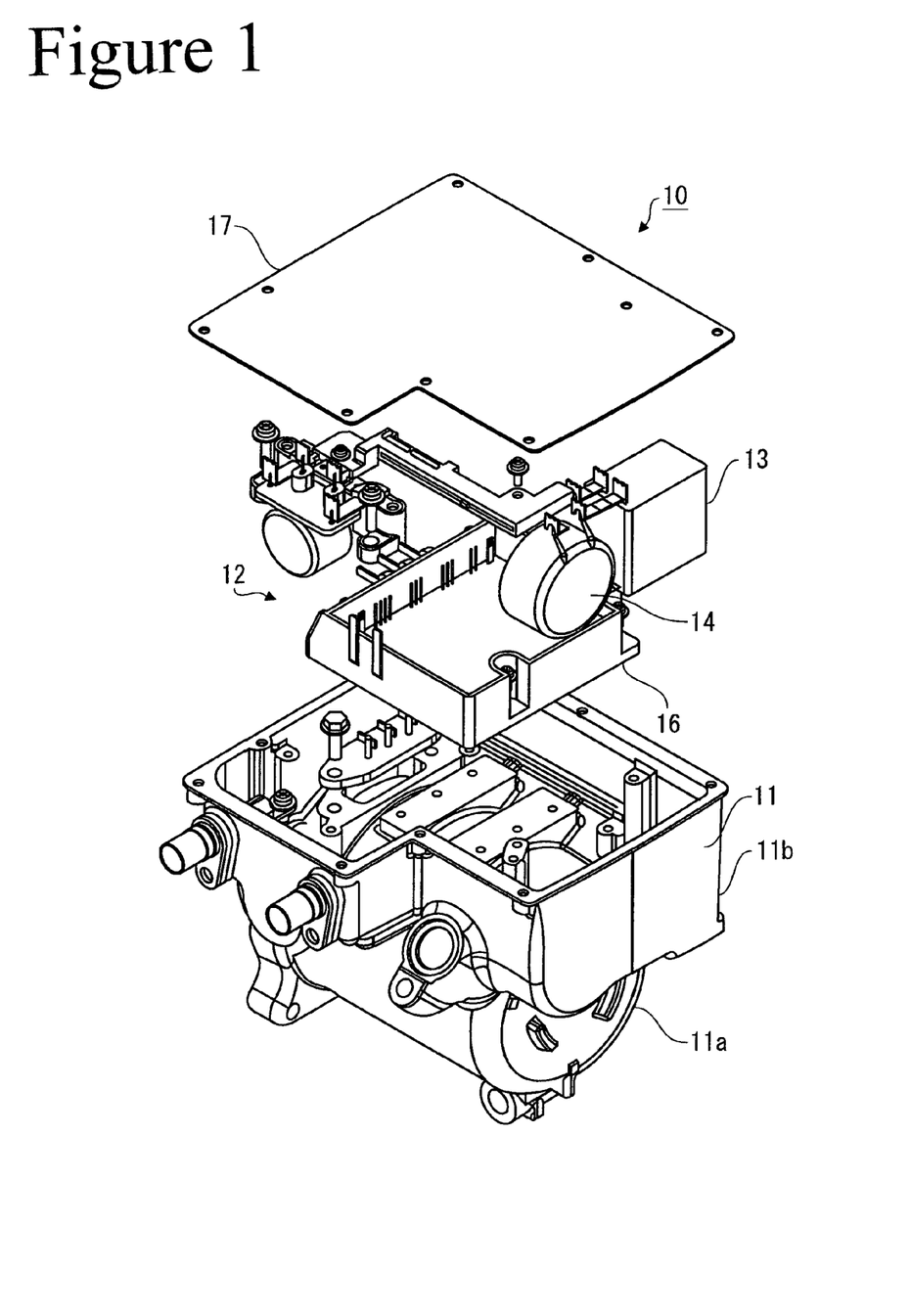
FIG. 1 is a diagram showing a general construction of an electric compressor.
Figure 2:
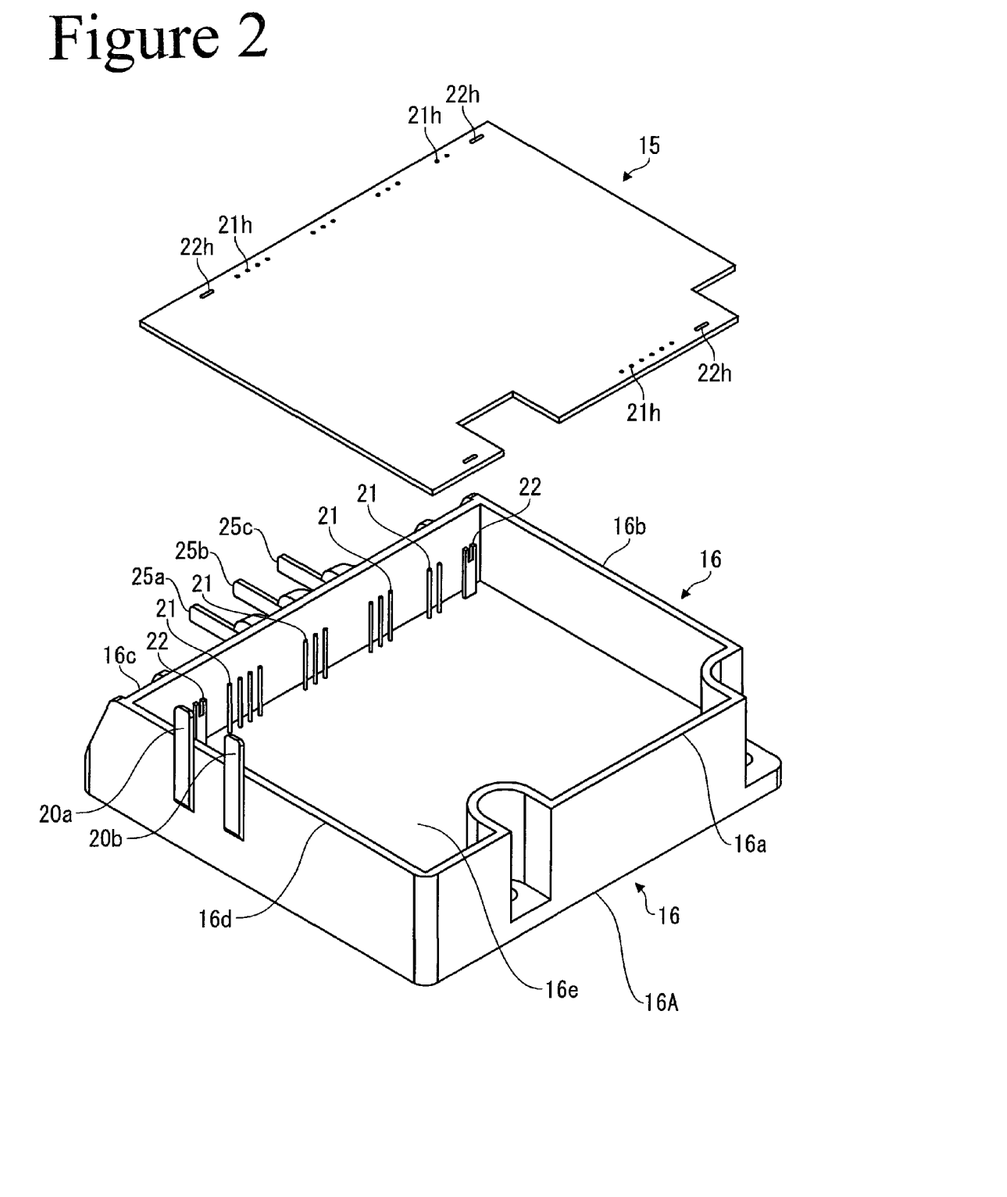
FIG. 2 is a perspective view showing a power board in which pin-like terminals are arranged in one row and a control circuit board.

FIG. 1 is an exploded perspective view showing an example of the construction of an electric compressor (an integrated electric compressor) 10, and FIG. 2 is a perspective view showing a control circuit board 15 and a power board 16 of the electric compressor 10, which are extracted.

As shown in FIG. 1, the electric compressor 10 is such that an electric motor (not shown) and a scroll type compressor (not shown) that sucks in a refrigerant and compresses and discharges the refrigerant are housed in a lower housing chamber 11a of a housing 11, that an inverter control apparatus 12 is housed in an upper housing chamber 11b of the housing 11 that opens upward, and that an upward opening of the upper housing chamber 11b is covered with a cover 17.

As shown in FIGS. 1 and 2, the inverter control apparatus 12 is provided with a capacitor 13 and a reactor 14 for smoothing a direct current voltage inputted to the inverter control apparatus 12, a control circuit board 15 (omitted in FIG. 1) for controlling the application of a high-voltage alternating current to the electric motor, and a power board 16 that converts the direct current supplied from a high-voltage power source into an alternating current and applies the alternating current to the electric motor, thereby causing the electric motor to be rotatably driven. The control circuit board 15 and the power board 16 are integrated and modularized before being assembled to the electric compressor 10.

To the power board 16 is supplied a high voltage, for example, 300 V from the external high-voltage power source (not shown). Upon the power board 16, there are provided a switching element composed of a plurality of IGBTs and detection circuits separately for current and voltage (none of them being shown). The control circuit board 15 is provided with a microcomputer for controlling the operation of this switching element. A control signal of the microcomputer is transmitted from the control circuit board 15 to the power board 16 and is inputted to the switching element, whereby the switching element goes into action. As a result of this, the high voltage supplied from the high-voltage power source becomes a three-phase alternating current, which is applied to the electric motor of the electric compressor 10 and causes the electric motor to be rotatably driven.

In a circuit configuration as described above, the power supply from the high-voltage power source to the power board 16 is performed via an input and output terminal. As shown in FIG. 2, this input and output terminal is composed of pin-like PN terminals 20a, 20b mounted on the power board 16. Electrical conduction is ensured by connecting lines (not shown), such as bus bars, to these PN terminals 20a, 20b from the high-voltage power source side.

The power board 16 is provided with UVW terminals 25a, 25b, 25c for electrically connecting the switching element and the electric motor. The PN terminals 20a, 20b and the UVW terminals 25a, 25b, 25c are integrated with a resin housing 16A while being insulated from each other by the housing 16A.

As shown in FIG. 2, the power board 16 has the box-shaped housing 16A, which is composed of a bottom plate 16e and an outer frame 16a, an outer frame 16b, an outer frame 16c and an outer frame 16d that are provided in a standing manner from a peripheral edge of the bottom plate 16e. The upper portion of the housing 16A is opened, and the control circuit board 15 is housed in this opening.

A plurality of pin-like signal transmission terminals 21 are arranged on the bottom plate 16e within the outer frame 16a, outer frame 16b, outer frame 16c and outer frame 16d of the power board 16. The signal transmission terminals 21 are intended for the signal transmission between the control circuit board 15 and the power board 16. The signal transmission terminals 21 are arranged along each of the outer frame 16a and the outer frame 16c, which are opposed to each other.

Bottom end parts of the signal transmission terminals 21 are buried in the bottom plate 16e and are electrically connected to bus bars (not shown), which are buried inside the bottom plate 16e. On the other hand, top end parts of the signal transmission terminals 21 are inserted into terminal insertion holes 21h of the control circuit board 15 housed in the upper portion of the opening of the housing 16A, and are soldered to the control circuit board 15.

Pin-like grounding terminals 22 are arranged at both ends of the row of the signal transmission terminals 21 on the bottom plate 16e within the outer frame 16a, outer frame 16b, outer frame 16c and outer frame 16d of the power board 16. The grounding terminals 22 are intended for the grounding of the control circuit board 15 and the power board 16 to the housing 11 of the electric compressor 10. The grounding terminals 22 are arranged on both sides of the outer frame 16a and the outer frame 16c, which are opposed to each other.

Bottom end parts of the grounding terminals 22 are buried in the bottom plate 16e and are electrically connected to bus bars (not shown), which are buried inside the bottom plate 16e. The bus bars are electrically connected to the housing 11. On the other hand, top end parts of the grounding terminals 22 are inserted into terminal insertion holes 22h of the control circuit board 15 housed in the upper portion of the opening of the housing 16A, and are soldered to the control circuit board 15.

Figure 4:
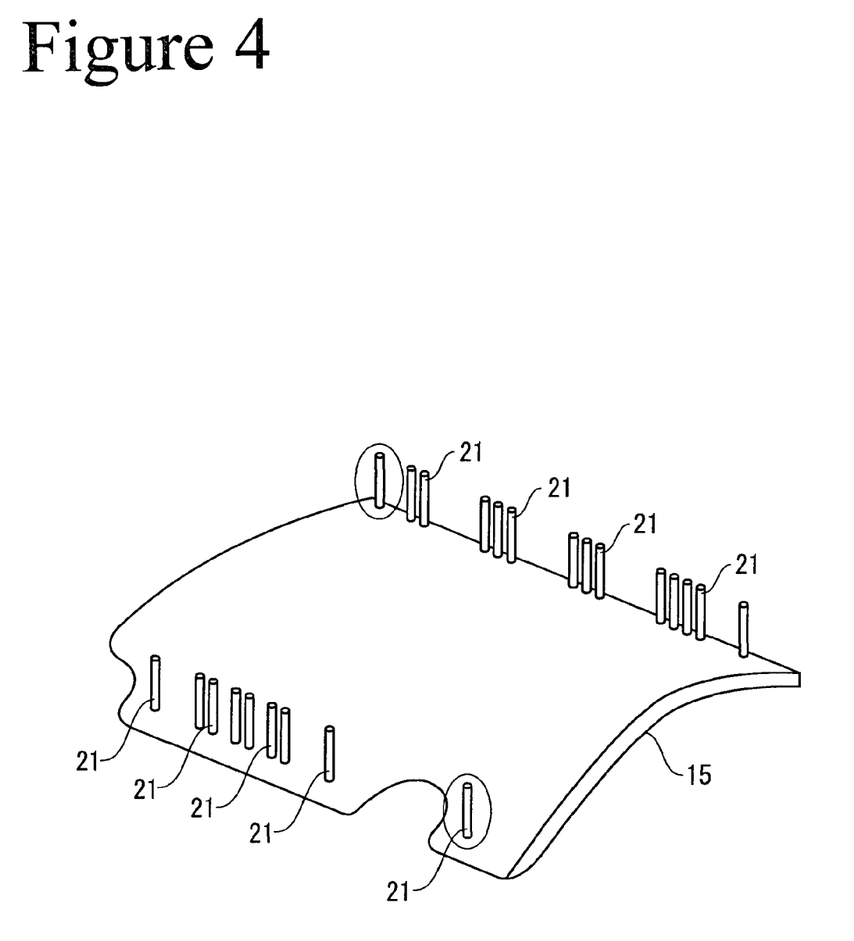
FIG. 4 is a diagram showing a deformed condition of a control circuit board.

As described above, the control circuit board 15 and the power board 16 are fixed by soldering and integrated. This integrated state was modeled and a vibration analysis of the control circuit board 15 was performed by the finite element method (FEM). In this analysis, a unit acceleration was applied in the thickness direction of the control circuit board 15. The result is shown in FIG. 4. The middle of the control circuit board 15 having no fixed point vibrates at a resonance frequency of the control circuit board 15. As a result, it became apparent that because stresses were concentrated on the signal transmission terminals 21 fixed to both ends of the control circuit board 15, the signal transmission terminals 21 surrounded by a circle in the figure became broken. Also in a vibration experiment conducted by using a control circuit board 15 and a power board 16 that were actually fixed, signal transmission terminals 21 in the same places became broken. Incidentally, in FIG. 4, the control circuit board 15 is arranged on the lower side and the illustration of the power board 16 is omitted. Also the illustration of the grounding terminals 22 is omitted.

When the signal transmission terminals 21 are arranged in one row as described above, the signal transmission terminals 21 may be broken. Therefore, in order to prevent this breakage, the present inventors made some improvements, which are shown in FIGS. 8 to 10.

Figure 8:
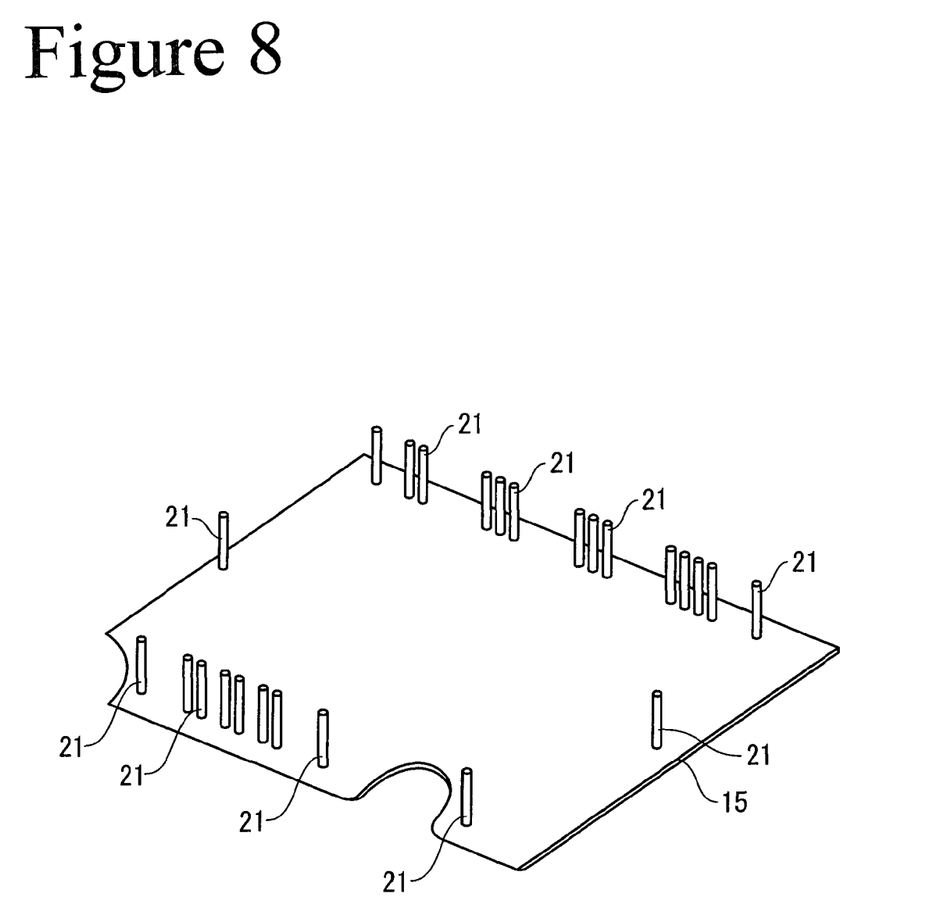
FIG. 8 is a diagram showing an example in which the arrangement of pin-like terminals is changed.

FIG. 8 shows a case where each of the signal transmission terminals 21 is provided in the middle of the width direction of the control circuit board 15 in the vicinity of the peripheral edge of the control circuit board 15. FIG. 9 shows a case where a signal transmission terminal 21 is provided at the center of the control circuit board 15. FIG. 10 shows a case where the number of the signal transmission terminals 21 to be provided is increased to twice the number in the examples of FIGS. 8 and 9.

Figure 9:
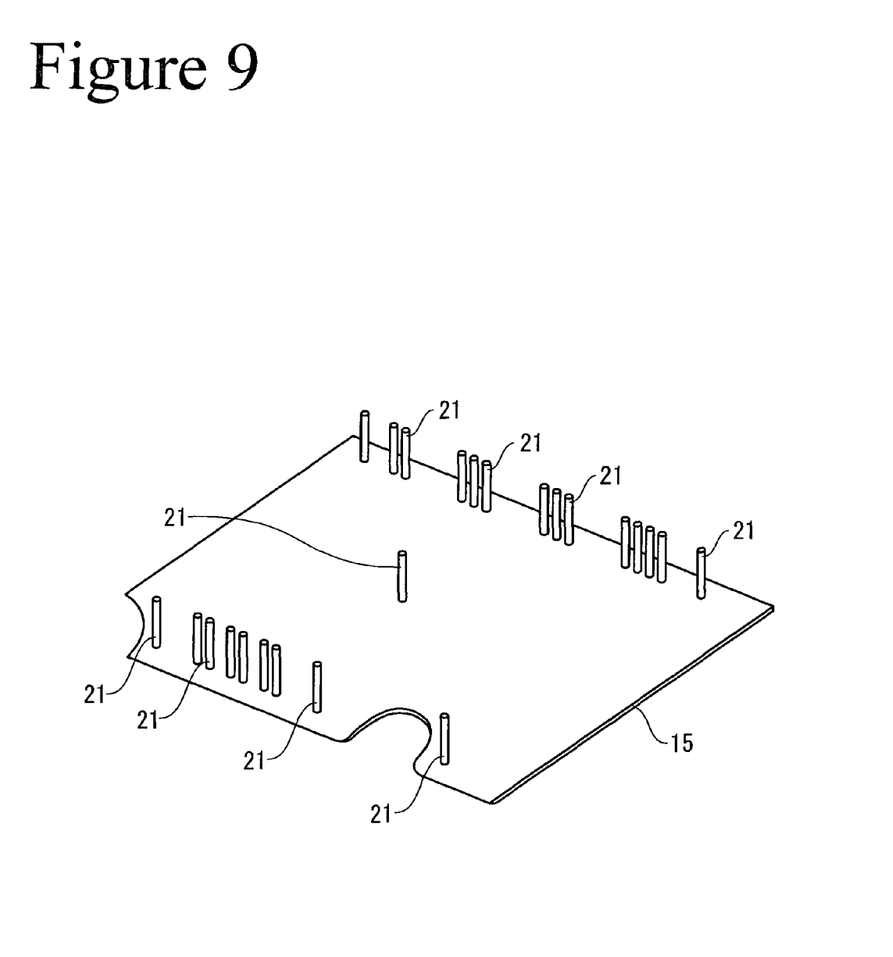
FIG. 9 is a diagram showing another example in which the arrangement of pin-like terminals is changed.
Figure 10:
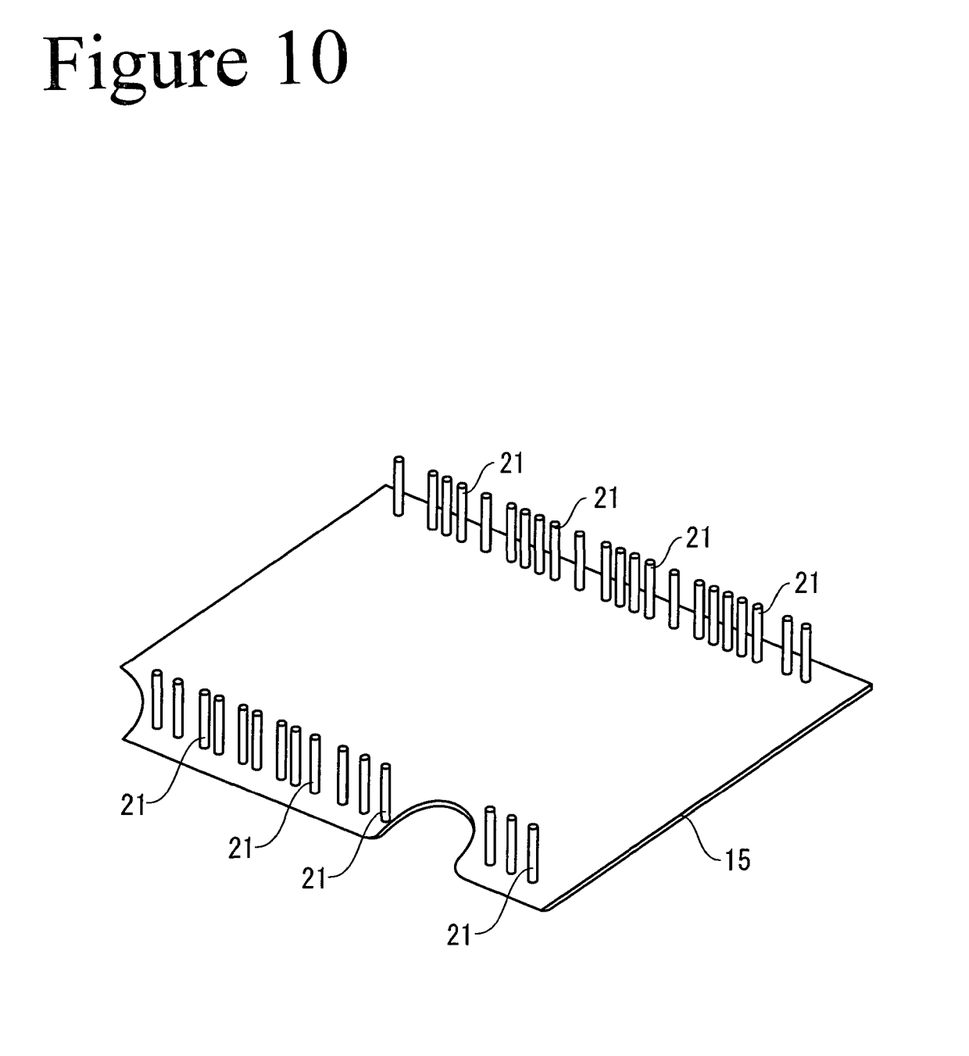
FIG. 10 is a diagram showing an example in which the number of pin-like terminals is increased.

A FEM analysis was performed also in the embodiments shown in FIGS. 8 to 10. When a maximum value of the stress applied to the signal transmission terminals 21 in the embodiment shown in FIG. 4 is taken as 100, a maximum value of the stress applied to the signal transmission terminals 21 in the embodiments shown in FIGS. 8 to 10 is expressed by an index as described below. It was ascertained that the reduction of the stress applied to the signal transmission terminals 21 was insufficient for preventing the breakage.

FIG. 4: 100

FIG. 8: 101

FIG. 9: 96

FIG. 10: 74

Figure 3:
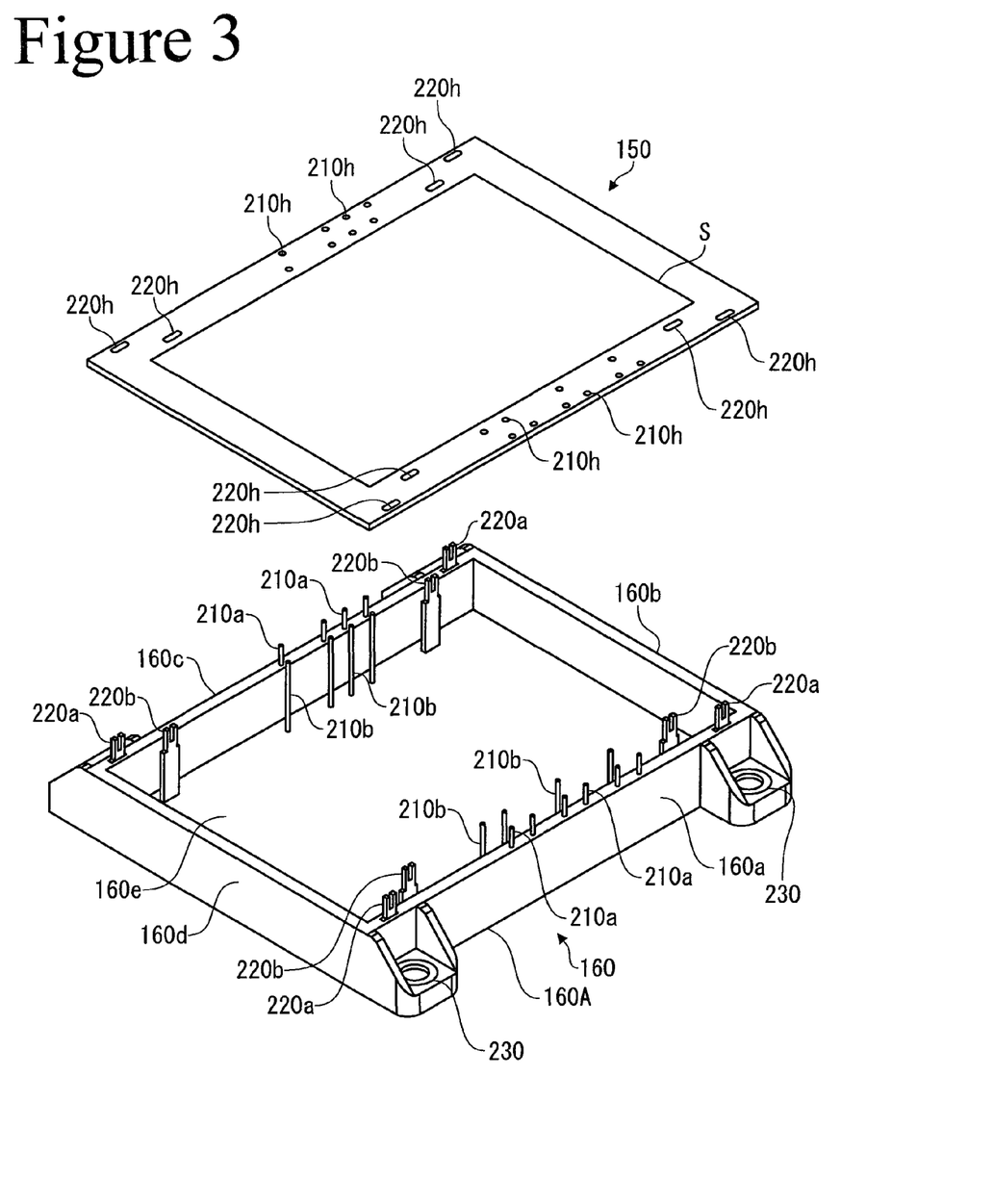
FIG. 3 is a perspective view showing a power board in which pin-like terminals are arranged according to the present invention and a control circuit board.

Therefore, in order to reduce the stresses applied to the terminals, the present inventors examined a control circuit board 150 and a power board 160 shown in FIG. 3. The construction of the control circuit board and the power board will be described below.

As shown in FIG. 3, the power board 160 has a box-shaped housing 160A, which is composed of a bottom plate 160e and an outer frame 160a, an outer frame 160b, an outer frame 160c and an outer frame 160d that are provided in a standing manner from a peripheral edge of the bottom plate 160e. The upper portion of the housing 160A is open. The housing 160A is made of resin.

A plurality of signal transmission terminals 210a are arranged along each of the outer frame 160a and the outer frame 160c of the power board 160, which are opposed to each other. The signal transmission terminals 210a are such that top ends thereof protrude from top surfaces of the outer frame 160a and the outer frame 160c and parts continuous to the top ends are buried into the outer frame 160a and the outer frame 160c. Similarly, grounding terminals 220a are arranged in both end portions of the outer frame 160a and outer frame 160c of the power board 160, which are opposed to each other. The grounding terminals 220a are such that top ends thereof protrude from the top surfaces of the outer frame 160a and the outer frame 160c, and parts continuous to the top ends are buried into the outer frame 160a and the outer frame 160c. The top end parts of the signal transmission terminals 210a are inserted into terminal insertion holes 210h of the control circuit board 150 placed on the top surfaces of the outer frame 160a, the outer frame 160b, the outer frame 160c and the outer frame 160d, and are soldered to the control circuit board 150. The grounding terminals 220a are such that some of the grounding terminals 220a are electrically connected to washers 230 fixed to four corners of the housing 160A. The same applies to grounding terminals 220b, which will be described later. Bolts are caused to pierce through the washers 230 and the power board 160 is fixed to the housing 160A, whereby the control circuit board 150 and the power board 160 are grounded to the housing 160A. On the other hand, the top end parts of the grounding terminals 220a are inserted into terminal insertion holes 220h of the control circuit board 150 placed on the top surfaces of the outer frame 160a, the outer frame 160b, the outer frame 160c and the outer frame 160d, and are soldered to the control circuit board 150.

As described above, the plurality of signal transmission terminals 210a and grounding terminals 220a are present in one row on each of the outer frame 160a and the outer frame 160c.

A plurality of signal transmission terminals 210b are arranged on the bottom plate 160e within the outer frame 160a, outer frame 160b, outer frame 160c and outer frame 160d of the power board 160. The signal transmission terminals 210b are arranged along the outer frame 160a and the outer frame 160c.

Bottom end parts of the signal transmission terminals 210b are buried in the bottom plate 160e and are electrically connected to bus bars (not shown), which are buried inside the bottom plate 160e. On the other hand, top end parts of the signal transmission terminals 210b are inserted into terminal insertion holes 210h of the control circuit board 150 placed on top surfaces of the outer frame 160a, the outer frame 160b, the outer frame 160c and the outer frame 160d, and are soldered to the control circuit board 150.

Grounding terminals 220b are provided on both terminals of the row of the signal transmission terminals 210b on the bottom plate 160e within the outer frame 160a, the outer frame 160b, the outer frame 160c and the outer frame 160d of the power board 160. The grounding terminals 220b are arranged on the outer frame 160a and the outer frame 160c, which are opposed to each other.

The grounding terminals 220b are such that bottom end parts thereof are buried in the bottom plate 160e and are electrically connected to bus bars (not shown), which are buried inside the bottom plate 160e. The bus bars are electrically connected to the housing 160A. On the other hand, top end parts of the grounding terminals 220b are inserted into terminal insertion holes 220h of the control circuit board 150 placed on the top surfaces of the outer frame 160a, the outer frame 160b, the outer frame 160c and the outer frame 160d, and are soldered to the control circuit board 150.

As described above, the plurality of signal transmission terminals 210b and grounding terminals 220b are present in one row on each of the outer frame 160a and the outer frame 160c. That is, the signal transmission terminals 210a and the grounding terminals 220a as well as the signal transmission terminals 210b and the grounding terminals 220b are arranged in two rows along the outer frame 160a (or the outer frame 160c).

Incidentally, these terminals are arranged in regions except a parts arrangement region of the control circuit board 150. The parts arrangement region is a region where electronic parts of a microcomputer and the like are provided, and refers to a region enclosed by a rectangle and indicated by S in FIG. 3. If the terminals are arranged within the parts arrangement region S, this limits the arrangement and positions of the electronic parts. Therefore, to avoid this, the terminals are arranged in regions except the parts arrangement region S.

A FEM analysis was performed also for the embodiment shown in FIG. 3. When a maximum value of the stress applied to the signal transmission terminals 21 in the embodiment shown in FIG. 4 is taken as 100, a maximum value of the stress applied to the signal transmission terminals 210a, 210b, and the grounding terminals 220a, 220b in the embodiment, shown in FIG. 3 is expressed by an index as 1. It became apparent that when the signal transmission terminals 210a and the grounding terminals 220a as well as the signal transmission terminals 210b and the grounding terminals 220b were arranged in two rows in this manner, the breakage of these terminals can be adequately prevented. The reason for this will be described below with reference to FIGS. 5 and 6.

Figure 5:
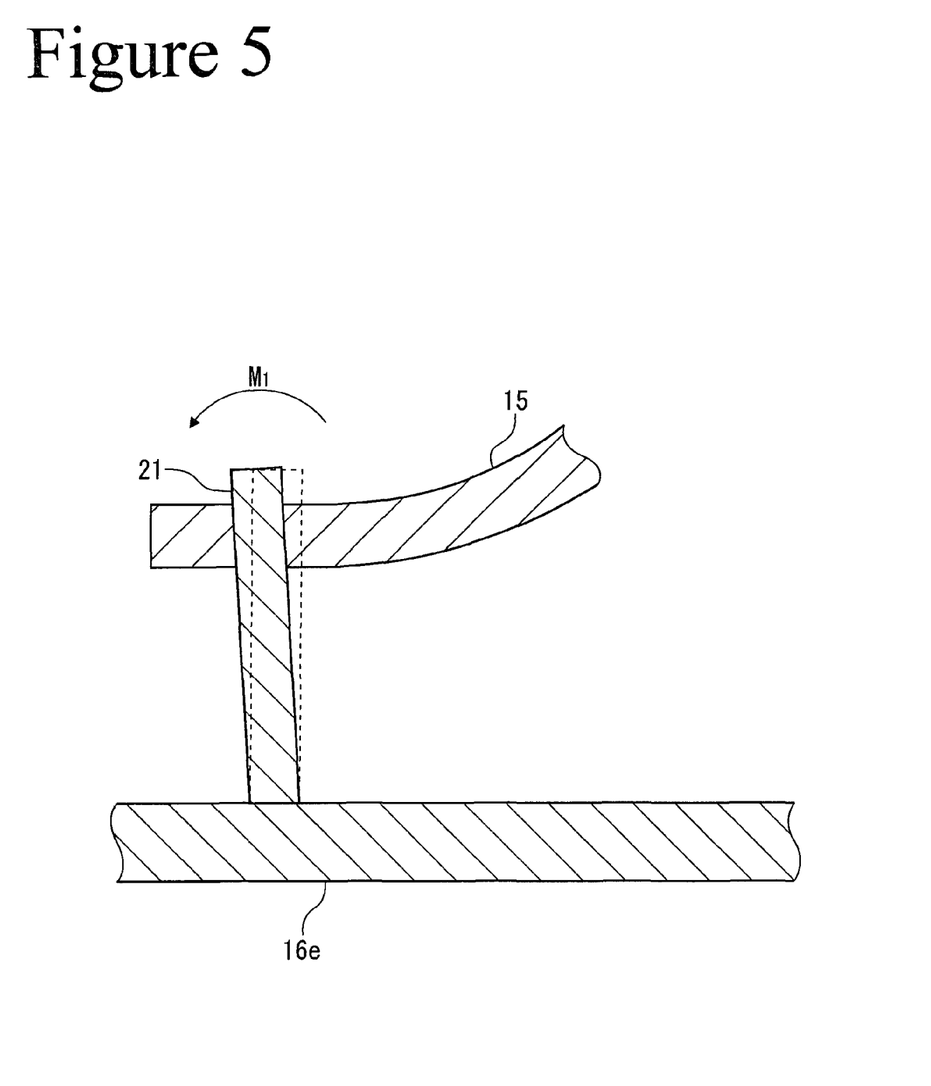
FIG. 5 is a diagram showing a deformed condition of a pin-like terminal that occurs when pin-like terminals are arranged in one row.

FIG. 5 is a partial sectional view showing how the deformation shown in FIG. 4 occurs in the control circuit board 15 due to the occurrence of vibrations in the control circuit board 15 and the power board 16 (the bottom plate 16e) in which the signal transmission terminals 21 are arranged in one row. As shown in FIG. 5, when the control circuit board 15 is deformed, a bending moment M1 occurs in the signal transmission terminal 21 and the signal transmission terminal 21 warps as indicated by the solid line. In the case of FIG. 5, the forward end (the left side in the figure) of the control circuit board 15 from the signal transmission terminal 21 is not mechanically constrained and, therefore, the signal transmission terminal 21 warps readily. The control circuit board 15 is deformed in such a manner that the bottom surface thereof becomes convex and in this case, a bending moment in a direction reverse to the direction of the bending moment M1 is generated in the signal transmission terminal 21 and the signal transmission terminal 21 warps in a direction reverse to the direction shown in FIG. 5. The continuation of vibrations results in repetitions of this warp, eventually leading to the breakage of the signal transmission terminal 21.

Figure 6:
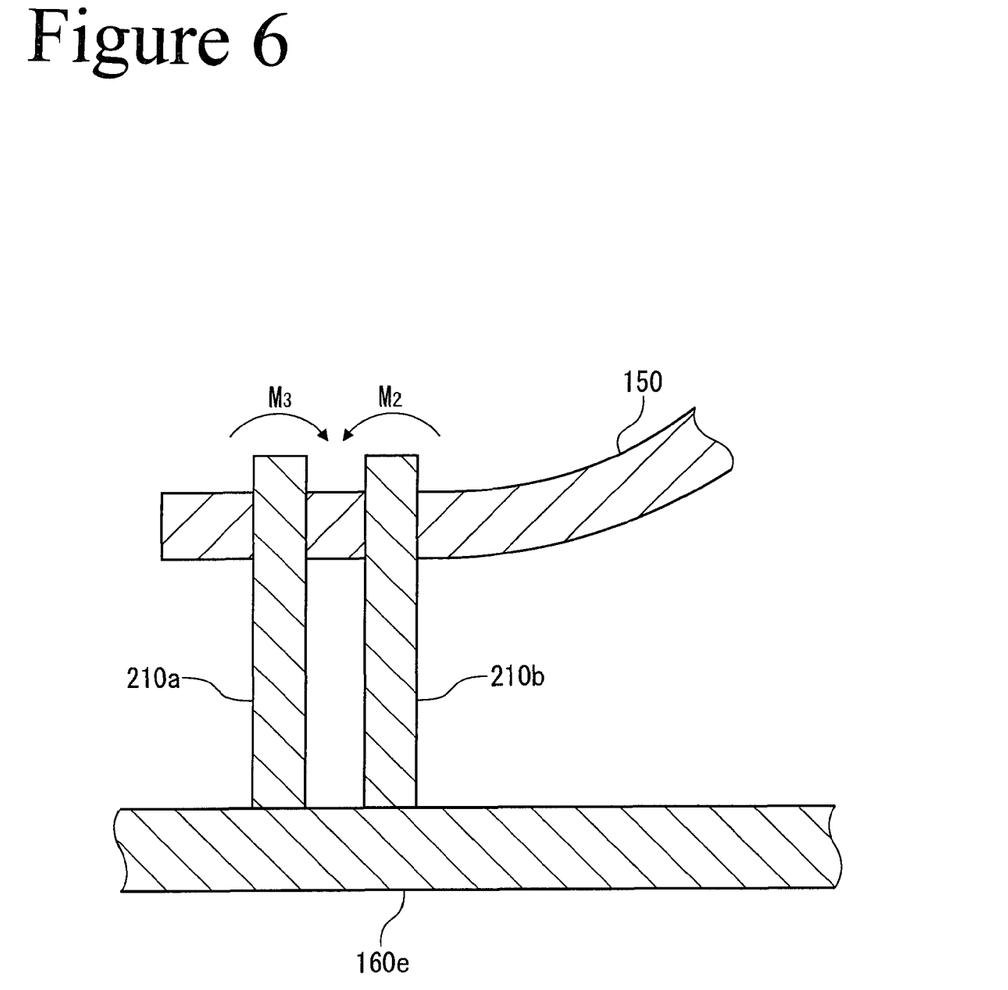
FIG. 6 is a diagram showing a deformed condition of pin-like terminals that occurs when pin-like terminals are arranged in two rows.

FIG. 6 shows a case where the signal transmission terminals 210a and the signal transmission terminals 210b are arranged in two rows.

When the signal transmission terminals 210a and the signal transmission terminals 210b are arranged in two rows, the control circuit board 150 becomes deformed and a bending moment M2 acts on the signal transmission terminal 210b on the inner side. However, because the signal transmission terminal 210a is fixed beyond the signal transmission terminal 210b of the control circuit board 150 (the left side in the figure), a moment M3 opposed to the bending moment M2 is generated and the signal transmission terminal 210a and the signal transmission terminal 210b are less apt to be deformed. For this reason, the signal transmission terminal 210a and the signal transmission terminal 210b become less apt to warp, thereby preventing breakage.

Figure 7:
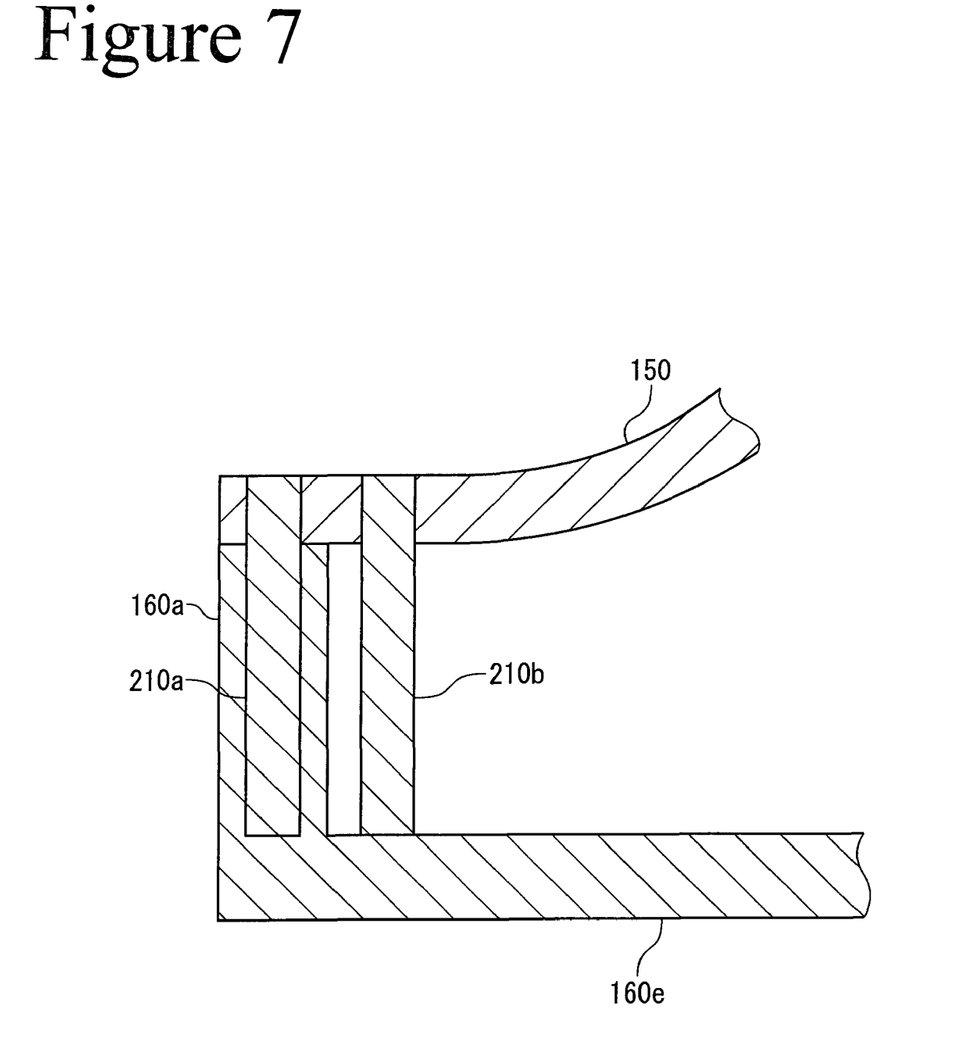
FIG. 7 is a diagram showing an example of the arrangement of pin-like terminals according to the present invention.

Incidentally, in the example shown in FIG. 3, as shown in FIG. 7, the part of the signal transmission terminal 210a on the outer side except the top end thereof is buried in the outer frame 160a (or the outer frame 160c). It is sufficient to arrange the signal transmission terminals 210b only in one row in the part of the bottom plate 160e if the signal transmission terminals 210a are arranged on the outer frame 160a (or the outer frames 160c) in this manner. Therefore, it is possible to ensure the parts arrangement region S in which electronic parts are installed on the bottom plate 160e and consequently, it is possible to reduce the size of the power board 160.

Although the embodiment in which the terminals were arranged in two rows was described above, it is apparent that the advantages of the present invention can be obtained even in the case of three or more rows. However, if the terminals are arranged in three or more rows, the space where the terminals are provided increases and this runs counter to the request for the downsizing of the electric compressor 10. Therefore, it is preferred that the terminals be arranged in two rows.

Although the example in which the terminals were arranged in one row on the outer frame 160a and the outer frame 160c and in one row on the bottom plate 160e was shown above, it is possible to arrange the terminals on the bottom plate 160e in two or more rows. Also in this case, as described with reference to FIG. 6, it is possible to enjoy the breakage preventing effect of the present invention.

Furthermore, it is needless to say that even in a case where part of the function of the control circuit board 150 is given to another substrate, this case is in the category of the present invention so long as a structure for soldering the terminals to the power board 160 exists.

The invention claimed is:

1. An electric compressor, comprising:
a compression mechanism that sucks in a refrigerant and compresses and discharges the refrigerant;
an electric motor that drives the compression mechanism;
an inverter control apparatus that has a power board that converts a direct current supplied from a high-voltage power source into an alternating current and applies the alternating current to the electric motor and a control circuit board that controls application of the alternating current to the electric motor and controls driving of the electric motor; and
a housing that houses the compression mechanism, the electric motor and the inverter control apparatus, wherein:
the power board is provided with a plurality of pin-like terminals for signal transmission to and from the control circuit board and for grounding along each of a pair of opposed sides;
the control circuit board is electrically connected to the plurality of pin-like terminals and is fixed by soldering to the plurality of pin-like terminals; and
the plurality of pin-like terminals are arranged along each of the pair of sides in a plurality of rows.

2. The electric compressor according to claim 1, wherein:
the power board is in the form of a box provided with a bottom plate and outer frames provided in a standing manner at peripheral edges of the bottom plate;
a row nearest to the side of the plurality of rows is provided on the outer frames; and
parts of the plurality of pin-like terminals belonging to the row nearest to the side are each buried in the outer frames, and other parts that are continuous to the parts are provided so as to protrude from top end surfaces of the outer frames.

3. The electric compressor according to claim 2, wherein the pin-like terminals for grounding belong to the row nearest to the side and are arranged in end portions of the side.

4. The electric compressor according to claim 2, wherein the power board and the control circuit board are integrated and modularized.

* * * * *